United States Patent [19]

Eccles et al.

[11] 4,232,312
[45] Nov. 4, 1980

[54] ANALOGUE ELECTRICAL INDICATORS HAVING A SERIES OF ELECTRICALLY-ENERGIZABLE ELEMENTS

[75] Inventors: Edward S. Eccles, Bishops Cleeve; Harry Gibson, Bredon, both of England

[73] Assignee: Smiths Industries Limited, London, England

[21] Appl. No.: 882,031

[22] Filed: Mar. 6, 1978

[51] Int. Cl.² .............................................. G06F 3/14
[52] U.S. Cl. .............................. 340/753; 340/166 EL; 340/791; 340/793
[58] Field of Search ............. 340/324 R, 324 M, 336, 340/166 EL, 753, 754, 791, 793

[56] References Cited

U.S. PATENT DOCUMENTS

| | | | |
|---|---|---|---|
| 3,275,871 | 9/1966 | Yiotis | 340/324 R |
| 3,351,928 | 11/1967 | Smola | 340/324 R |
| 3,376,452 | 4/1968 | Lally | 340/324 R |
| 3,914,758 | 10/1975 | Ingle | 340/336 |
| 4,027,197 | 5/1977 | Coleman | 340/324 M |

Primary Examiner—Marshall M. Curtis
Attorney, Agent, or Firm—Pollock, Vande Sande & Priddy

[57] ABSTRACT

An electrical indicator has a consecutive series of light-emitting diodes which are arranged along a straight or curved reference scale. A limited region of the series, comprising several diodes, is energized and this illuminated region is displaced along the scale upon change in an electrical input variable supplied to the indicator such that the position of the region provides an analogue indication of the value of the input variable. To improve the appearance of the display and reduce power consumption, the brightness of the region varies along its length with one or both of the outermost diodes being energized at lower levels than another of the diodes. The indicator may include a shift register having a number of storage locations, each for storing signals representative of a corresponding one of the light-emitting diodes, the signals at these locations being displaced in accordance with change in value of the input variable. Signals output from each storage location of the shift register are supplied to a gate which controls switching of a transistor that is connected in series with a resistor in the energizing circuit of each light-emitting diode. Each energizing circuit includes two such transistors and associated gates which control the degree of brightening of each light-emitting diode by switching one or more resistors in parallel in the circuit. The gates are connected to control brightening of one diode in accordance with brightening of one or more other diodes.

11 Claims, 7 Drawing Figures

ANALOGUE ELECTRICAL INDICATORS HAVING A SERIES OF ELECTRICALLY-ENERGIZABLE ELEMENTS

BACKGROUND OF THE INVENTION

This invention relates to electrical indicators.

The present invention is concerned especially with electrical indicators of a kind in which an analogue representation in accordance with the value of an input variable is provided by selective brightening along a reference scale (whether calibrated or otherwise) of a series of electrically-energizable light-emitting elements.

Electrical indicators of this latter kind (referred to herein as "of the kind specified") have already been proposed, and in this respect it has been proposed to arrange that only one of the elements is selected for energization at any time, so that brightening occurs at only one point along the scale. The selection of the particular element energized, and thereby of the location along the scale of the brightening, is in this case made in accordance with the value of the input variable such that the displacement of the brightening point from the scale zero or other datum provides a measure of that value. The indication provided is therefore analogous to that provided by a conventional mechanical-pointer instrument, but with the 'reading' against the scale signified in this case by the bright, energized element rather than by the pointer. Although such an indication may be entirely satisfactory, there are circumstances in which it may be indistinct. These circumstances arise especially where significant accuracy of indication is required against the scale since the width of each element, and therefore its visual distinguishability when energized, is then necessarily limited.

The problem of ensuring adequate visual distinguishability can be overcome by arranging that instead of energizing just the one element, all the other elements of the series up to that element are energized also. The indication provided under this mode of operation is comparable with that provided by a conventional thermometer, the 'reading' in this case being taken by reference to the location against the scale of the readily distinguishable interface between the energized, bright elements and the unenergized, dark elements. However, a very substantial increase in electrical-power dissipation in the indicator is in general required for this mode of operation, and this can present an electrical-supply or operating-temperature problem, or both. Such problems become especially relevant where a large number of indicators are required to be operated together.

BRIEF SUMMARY OF THE INVENTION

It is an object of the present invention to provide an electrical indicator of the kind specified that enables adequate visual distinguishability to be achieved without the requirement for very substantial increase in electrical-power dissipation.

According to one aspect of the present invention there is provided an electrical indicator of the kind specified wherein it is arranged that a predetermined plurality of consecutive elements of said series are energized so as to provide brightening throughout only a correspondingly limited region of said series, the particular elements energized, and thereby the particular region involved and its displacement relative to a scale datum, being dependent on said value, and wherein it is also arranged that the degree of brightening varies within said region.

The fact that brightening is provided throughout a region embracing a plurality of light-emitting elements, readily enables adequate distinguishability to be achieved with the electrical indicator of the present invention. Because the region is of a limited extent, power dissipation can however be kept low, and the variation in the degree of brightening within the region may be such that only one of the elements is fully energized to signify the appropriate location for the 'reading' against the scale. This one fully energized element may be the element which in the relevant region is furthest from (or nearest to) the scale zero or other datum; alternatively, the central (or some other intermediate) element of the region may be involved. Whatever the case, other elements of the region may be energized such that they are all of the same, lesser brightness or, alternatively, such that the brightness decreases progressively through the region away from the brightest element. The degree of brightening of the diodes varies within the region; for example, the central diode of the region can be brightened to one level and the diodes in the region to either side can be brightened to one or more lower brightened levels. Alternatively, the outermost diode can be brightened to one level and diodes in the region to one side can be brightened to successively lower levels away from the outermost diode. The outermost diode could, however, be brightened in accordance with the extent to which the value of the input variable occupies the outermost diode. In this respect, diodes in a part of the region to one side of the outermost diode could be brightened to different discrete levels such that the brightness of that part of the region decreases progressively along its length, the outermost element being brightened to one of those levels in accordance with the extent to which the value of the input variable occupies the outermost diode.

An electrical indicator in accordance with the present invention will now be described, by way of example, with reference to the accompanying drawings.

DETAILED DESCRIPTION

Figure 1:
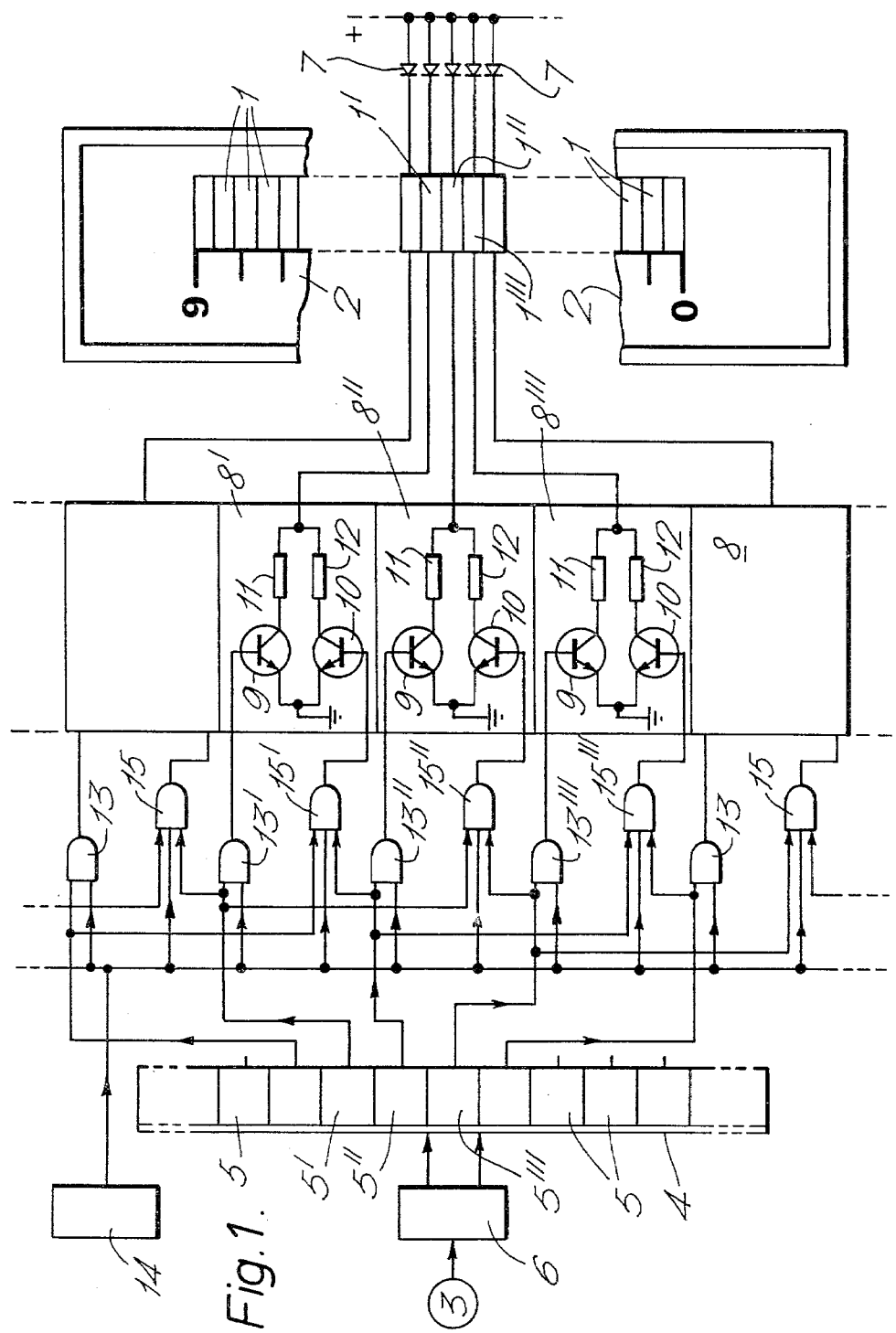
FIG. 1 is a schematic illustration of the electrical indicator.
Figure 2:
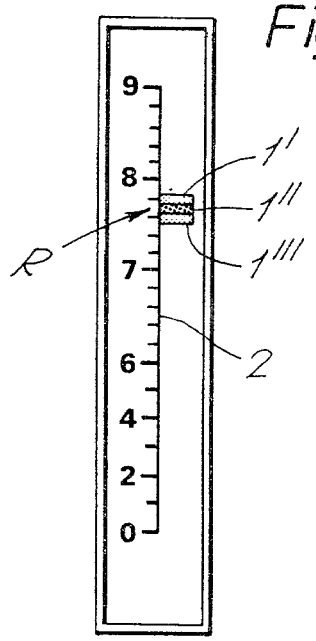
FIG. 2 illustrates the form of display provided by the indicator of FIG. 1.

Referring to FIGS. 1 and 2, a multiplicity of light-emitting diodes or elements 1 are mounted side by side and in abutment one with the other, throughout the length of a straight, calibrated scale 2 of the indicator. Only three of the series of elements 1 are, in this example, energized at any time so that there is brightening against the scale 2 throughout only the limited region—designated in FIG. 2 as region R—occupied by the three. The particular set of three elements 1', 1" and 1''', of the series energized, and thereby the particular region R of the scale 2 involved, is dependent on the value of the variable parameter to be indicated. In this respect the value of the input variable as signalled to the indicator from some external source, such as for example source 3 illustrated in FIG. 1, determines the displacement along the scale 2 from the scale zero-datum of the bright region R. More particularly the location along the scale 2 of the central element 1″ of the set of three provides a measure, and thereby a 'reading', of the signalled value.

As illustrated in FIG. 2, the central element 1″ is distinguished from the other two elements 1′ and 1‴ of the region R by its increased brightness. The brighter element 1″ accordingly defines a narrow 'pointer' against the scale 2 enabling accurate reading of the indicated variable to be made. The other two, less-bright elements 1′ and 1‴ of the set, one to each side of the central element 1″, extend the area of brightness and in this manner enhance the visual distinguishability of the indication provided as compared with what would obtain if just the single element 1″ were energized. Furthermore, because only three elements 1 are energized at any time the electrical-power dissipation is substantially reduced as compared with what in general would apply if a 'thermometer-type' display—requiring energization of all elements 1 along the scale 2 from the zero-datum up to and including the element 1″ (but not the element 1′)—were to be used. In addition, the electrical-power dissipation of the display is in general the same for all values (except those close to the zero-datum and those close to the full-scale reading) of the input parameter whereas, if a 'thermometer-type' display were used, this dissipation would increase with increasing values of the input parameter as correspondingly more elements were energized.

Referring more particularly to FIG. 1, the three light-emitting elements 1 that are to be energized in accordance with the value of the parameter signalled from the source 3, are selected under control of a multi-stage shift-register 4. The series of elements 1 along the scale 2 are individually associated with successive stages 5 of the shift register 4, and energization of any element 1 in the series is dependent on whether the stage 5 associated therewith contains 'ONE' or 'ZERO'. More particularly, only three consecutive stages 5 of the register 4 contain 'ONE', and these three 'ONE'-containing stages are shifted up or down in location throughout the register 4 under control of a shift-unit 6. The unit 6 is responsive to the input signal from the source 3 to locate the three-'ONE's pattern in the stages 5′, 5″ and 5‴, associated with the respective light-emitting elements 1′, 1″ and 1‴, appropriate to indication as illustrated in FIG. 2, of the signalled value.

Each light-emitting element 1 has its own individual energizing circuit that comprises a diode 7 and transistor switch 8 connected in series with the respective element 1. The switches 8 each include two transistors 9 and 10 that have their emitter-collector current paths connected, via equal resistors 11 and 12 respectively, in shunt with one another. The emitter-collector path of the transistor 9 of the switch 8 is conductive to pass current to energize the respective light-emitting element 1 only if the particular stage 5 of the register 4 associated with that element 2, contains 'ONE'. More particularly an individual gate 13 is responsive to the condition in which the stage 5 contains 'ONE' to pass pulses (having a nominal repetition frequency of 1 kHz) from a common pulse-supply source 14 to the base electrode of the transistor 9, so as thereby to supply current pulses to the element 1. Energization of the element 1 in this way is supplemented by corresponding current pulses supplied via the emitter-collector path of the transistor 10 if the immediately preceding and succeeding stages 5 both also contain 'ONE'. In the latter event an individual gate 15 connected to these two stages 5 is enabled to pass the pulses from the source 14 to the base electrode of the transistor 10, and thereby double the magnitude of current supplied to the individual element 1.

Thus with the example referred to above, where the stages 5′, 5″ and 5‴ associated with the elements 1′, 1″ and 1‴ all contain 'ONE', the gates 13′, 13″ and 13‴ connected to those stages pass pulses from the source 14 to the transistors 9 of their associated switches 8′, 8″ and 8‴. Furthermore, the gate 15″ is responsive to the condition in which the stages 5′ and 5‴ both contain 'ONE', the pass the same pulses to the transistor 10 of the switch 8″. These pulses are not passed by gate 15′ or gate 15‴ since although the stage 5″ contains 'ONE' the other stage 5 to which that gate is connected contains 'ZERO'. Thus although the three elements 1′, 1″ and 1‴ are energized to emit light, via the transistors 9 of their respective switches 8, it is only the central element 1″ of the three that is also energized via the transistor 10 of its switch 8, to provide the maximum brightness of emitted light.

The general level of brightness of the display provided by the energized three elements 1 of the indicator may be readily regulated by varying the repetition frequency of the pulses supplied from the source 14.

Figure 3:
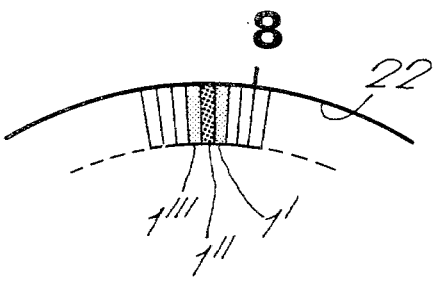
FIGS. 3 to 6 serve to illustrate to enlarged scale, modifications of the indicator of FIGS. 1 and 2.

Although the indicator described above with reference to FIGS. 1 and 2 has a straight scale, the light-emitting elements 1 may alternatively be arranged in an arc or circle around a correspondingly arcuate or circular scale 22, as illustrated in FIG. 3. Furthermore, other display modes may be utilized as illustrated in FIGS. 4, 5 and 6, the implementation of such different modes merely requiring appropriate changes in the gating-logic associated with the switches 8 and their control from the shift register 4.

Figure 4:
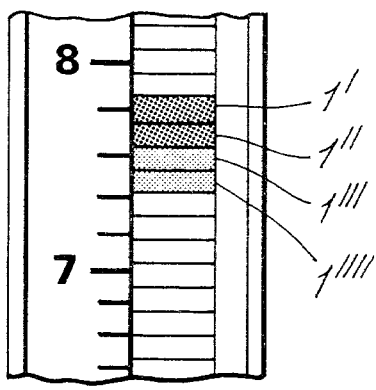

Referring to FIG. 4, four elements 1 are in this case energized at the same time, the two elements 1′ and 1″ furthermost from the zero-datum of the scale 1 being energized to the maximum degree of brightness whereas the other two elements 1‴ and 1‴ are energized to the lesser degree. A four-'ONE's pattern is in this case used in the register 4, and the display produced is comparable with a 'thermometer-type' display. In the latter respect, reading is taken from the interface between the furthermost element, 1′, and the dark region beyond it.

Figure 5:
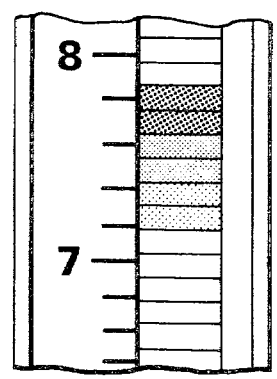
Figure 6:
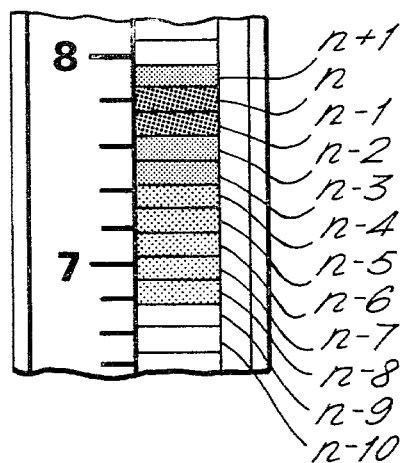

More than the four light-emitting elements 1 may be energized at any time and in this respect FIG. 5 illustrates an extension of the arrangement of FIG. 4 in which a further pair of elements 1 are energized but at a reduced degree of brightness with respect to the other two pairs of elements. This is achieved by providing for three possible degrees of energization-brightness utilizing, say, a further transistor and resistor connected in shunt with the transistors 9 and 10 in each switch 8, and extending both the gating-logic and the 'ONE's-pattern in the register 4, appropriately.

The gradual decrease in the brightness of the elements away from the reading interface, as achieved more especially in the case of the indicator-display of FIG. 5, can be readily extended further to give a more pronounced 'comet-tail' appearance directing the eye towards the interface.

The forms of displays described with reference to FIGS. 4 and 5 suffer from the disadvantage that, as the value to be indicated increases, the next element in the display is brightened suddenly, in a fashion which can be visually distracting to an observer. If the value to be indicated is oscillating slowly then this can cause a particularly distracting winking of the element furthermost from the zero-datum. This effect can be reduced in the display shown in FIG. 6. In this display, when the value of the parameter to be indicated corresponds exactly with the element n, this element will be brightened to the greatest degree and the adjacent element $n+1$, above element n, will remain unbrightened, as in the displays of FIGS. 4 and 5. However, if the value of the parameter rises to a level lying between those levels corresponding respectively with the elements n and $n+1$ then, instead of element $n+1$ remaining unbrightened, as in the previous displays, it is partially brightened (as shown in FIG. 6) in accordance with the degree to which the parameter overlaps this element.

Figure 7:
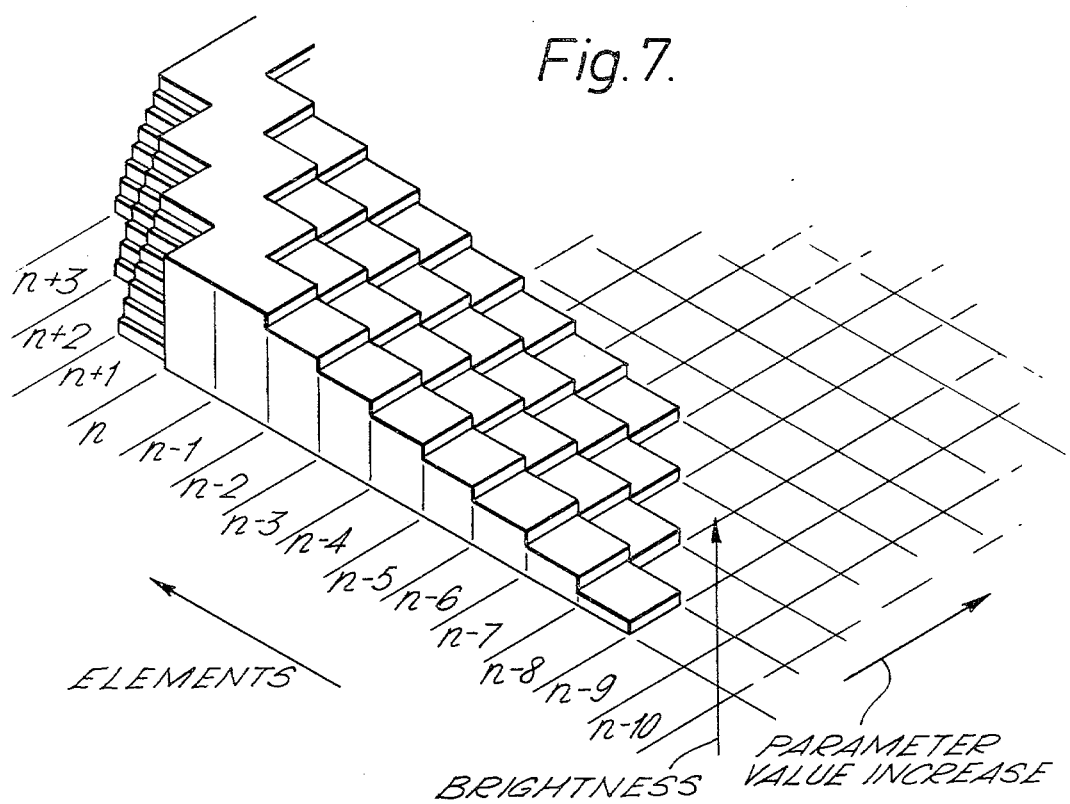
FIG. 7 is a graph showing the variation in brightness over a region of the display of FIG. 6.

The brightness of the element $n+1$ is most conveniently controlled in a step-by-step manner as shown in FIG. 7. The graph in FIG. 7 shows the way in which the brightness of each element of the display in FIG. 6 changes as the value of the parameter to be indicated increases. The display is of the 'comet-tail' type having its leading two elements n and $n-1$ of the same brightness and its seven trailing elements $n-2$ to $n-8$ at successively lower brightness levels. As the value of the parameter increases, it can be seen that the element $n+1$ in front of the leading element n is brightened to a level corresponding to that of element $n-8$ and that, as the parameter further increases, the element $n+1$ is brightened in a step-by-step manner to successively brighter levels corresponding with those levels applied to the trailing elements $n-8$ to $n-2$. The brightness of element $n+1$ rises until it is the same as the brightness of element n, and therefore becomes the new leading element, at which point the brightness of elements $n-1$ to $n-9$ are correspondingly reduced as shown. Increase in the value of the parameter, therefore, is represented on the display by a relatively gradual increase in brightness of the element above the leading element rather than the previous sudden brightening. Similarly, decrease in the value of the parameter causes a corresponding gradual reduction in brightness of the topmost element; in this way, winking of this element is avoided upon oscillatory fluctuations in the value of the parameter.

We claim:

1. In an electrical indicator of the kind in which an analogue representation in accordance with the value of an input variable is provided by selective brightening along a reference scale of a consecutive series of electrically-energizable light-emitting elements, the said indicator including energizing means for energizing a predetermined plurality of consecutive elements of said consecutive series so as to provide brightening throughout only a corresponding limited region of said series, the improvement wherein said energizing means includes means for energizing an element of said series outermost in the said region to a lower brightness level than another of said elements within said region, and means for displacing said energized region along the length of the consecutive series in dependence upon the value of the input variable.

2. An electrical indicator according to claim 1 wherein said light-emitting elements are light-emitting diodes.

3. An electrical indicator according to claim 1 wherein said energizing means is arranged to energize a central element of said region to one brightening level and to energize elements in said region to either side of said central element to one or more lower brightening levels.

4. An electrical indicator according to claim 1 wherein said energizing means is arranged to energize the other outermost element of said region to one brightening level and to energize elements in said region to one side of said other outermost element to one or more lower brightening levels.

5. An electrical indicator according to claim 4 wherein said energizing means is arranged to energize the said elements in said region to one side of said other outermost element to successively lower levels away from said other outermost element.

6. An electrical indicator according to claim 1 wherein said energizing means is arranged to energize an outermost element of said region in accordance with the extent to which the value of the said input variable occupies the said outermost element.

7. An electrical indicator according to claim 6 wherein said energizing means is arranged to energize each of said elements within a part at least of said region to a different one of a predetermined number of discrete brightening levels such that the brightness of the said part of said region decreases progressively along its length, and wherein the said energizing means is arranged to energize said outermost element to one of said discrete brightening levels in accordance with the extent to which the value of the said input variable occupies the said outermost element.

8. An electrical indicator according to claim 1 wherein said energizing means includes an energizing circuit associated with each said element, and wherein each said energizing circuit includes first switching means, first resistor, means connecting said first switching means in series with said first resistor, second switching means, second resistor, means connecting said second switching means in series with said second resistor, and means connection said first switching means and said first resistor in parallel with said second switching means and said second resistor so that said first and second resistors can be switched into or out of said energizing circuit so as thereby to control energization of said associated element.

9. An electrical indicator according to claim 8 including a plurality of first and second gate means, means connecting each said first and second gate means with a respective one of said first and second switching means so as to control switching thereof, means connecting an input of said second gate means associated with one of said elements, to receive signals supplied to an input of said first gate means associated with another one of said elements, so that the said second gate means is responsive to control switching of said second switching means in accordance with the existence of a predetermined input signal to said first gate means and so as thereby to control energization of said one element in accordance with energization of said other element.

10. An electrical indicator according to claim 1 including a shift register, said shift register having a plurality of storage locations therein each said location for storing signals representative of a corresponding one of said elements, means connecting each said storage location to said energizing means so that energization of each said element is controlled in accordance with signals stored at a corresponding storage location, and means for displacing said signals within said shift register in accordance with change in value of said input variable.

11. An electrical indicator of the kind in which an analogue representation in accordance with the value of an input variable is provided by selective brightening along a reference scale of a series of electrically-energizable light-emitting elements, said indicator comprising: a series of electrically-energizable light-emitting elements; a shift register having a plurality of storage locations therein, each said location for storing signals representative of a corresponding one of said elements; a plurality of first gate means, each of said first gate means being associated with an individual one of said elements; means for supplying signals output from each said storage location to an individual one of said first gate means; a plurality of second gate means, each said second gate means being associated with an individual one of said elements; means for supplying those signals supplied to said first gate means associated with one of said elements to said second gate means associated with another of said elements; a plurality of energizing circuits, each said circuit including: first switching means, first resistor, means connecting said first switching means in series with said first resistor, second switching means, second resistor, means connecting said second switching means in series with said second resistor, and means connecting said first switching means and said first resistor in parallel with said second switching means and said second resistor; means connecting the output of each said first and second gate means to a respective one of said first and second switching means so as thereby to control switching of said first and second resistors into or out of each said energizing circuit and hence to control energization of said one element in accordance with energization of said other element such that brightening is provided of a plurality of consecutive elements throughout only a correspondingly limited region of said series, and such that the degree of brightness of said elements appears to differ along said region.

* * * * *